United States Patent
Lin et al.

(10) Patent No.: US 9,378,785 B2
(45) Date of Patent: Jun. 28, 2016

(54) RESISTIVE RANDOM-ACCESS MEMORY DEVICES

(71) Applicant: INDUSTRIAL TECHNOLOGY RESEARCH INSTITUTE, Hsinchu (TW)

(72) Inventors: Chih-He Lin, Yunlin County (TW); Sih-Han Li, New Taipei (TW); Wen-Pin Lin, Kaohsiung (TW); Shyh-Shyuan Sheu, Taipei (TW)

(73) Assignee: Industrial Technology Research Institute, Hsinchu (TW)

( * ) Notice: Subject to any disclaimer, the term of this patent is extended or adjusted under 35 U.S.C. 154(b) by 202 days.

(21) Appl. No.: 13/974,001

(22) Filed: Aug. 22, 2013

(65) Prior Publication Data

US 2014/0115243 A1     Apr. 24, 2014

(30) Foreign Application Priority Data

Oct. 23, 2012 (TW) .............................. 101139018 A

(51) Int. Cl.
*G11C 11/00* (2006.01)
*G11C 7/10* (2006.01)
*G11C 13/00* (2006.01)

(52) U.S. Cl.
CPC .......... *G11C 7/1072* (2013.01); *G11C 13/0002* (2013.01); *G11C 13/004* (2013.01); *G11C 13/0069* (2013.01); *G11C 2013/0047* (2013.01); *G11C 2013/0054* (2013.01); *G11C 2013/0076* (2013.01)

(58) Field of Classification Search
CPC ................... G11C 13/0002; G11C 2013/0076; G11C 7/1072; G11C 2013/0054
USPC ........................................................ 365/148
See application file for complete search history.

(56) References Cited

U.S. PATENT DOCUMENTS

| 6,552,923 | B2 | 4/2003 | Houston |
| 6,563,753 | B1 | 5/2003 | Rickes et al. |

(Continued)

FOREIGN PATENT DOCUMENTS

| CN | 1819054 | 8/2006 |
| CN | 101802921 | 8/2010 |

(Continued)

OTHER PUBLICATIONS

Cong Xu et al., "Design Implications of Memristor-Based RRAM Cross-Point Structures", Design, Automation & Test in Europe Conference & Exhibition, Mar. 2011, pp. 1-6, IEEE, US.

(Continued)

*Primary Examiner* — Ernest Unelus

(57) ABSTRACT

A resistive random-access memory device includes a memory array, a read circuit, a write-back logic circuit and a write-back circuit. The read circuit reads the data stored in a selected memory cell and accordingly generates a first control signal. The write-back logic circuit generates a write-back control signal according to the first control signal and a second control signal. The write-back circuit performs a write-back operation on the selected memory cell according to the write-back control signal and a write-back voltage, so as to change a resistance state of the selected memory cell from a low resistance state to a high resistance state, and generates the second control signal according to the resistance state of the selected memory cell.

17 Claims, 9 Drawing Sheets

(56) References Cited

U.S. PATENT DOCUMENTS

| | | | |
|---|---|---|---|
| 7,291,878 B2 | 11/2007 | Stipe | |
| 7,463,502 B2 | 12/2008 | Stipe | |
| 7,619,917 B2 | 11/2009 | Nirschl et al. | |
| 7,952,909 B2 | 5/2011 | Inoue et al. | |
| 7,990,761 B2 | 8/2011 | Gordon et al. | |
| 8,183,565 B2 | 5/2012 | Parkinson | |
| 2004/0245547 A1 | 12/2004 | Stipe | |
| 2005/0185445 A1* | 8/2005 | Osada et al. | 365/148 |
| 2008/0037349 A1 | 2/2008 | Stipe | |
| 2008/0062793 A1 | 3/2008 | Waller et al. | |
| 2009/0244962 A1 | 10/2009 | Gordon et al. | |
| 2010/0214818 A1* | 8/2010 | Kitagawa et al. | 365/148 |
| 2011/0051518 A1 | 3/2011 | Fujimura | |
| 2011/0240943 A1 | 10/2011 | Gordon et al. | |
| 2013/0044535 A1* | 2/2013 | Shimakawa | 365/148 |
| 2013/0212431 A1* | 8/2013 | Ong | 714/15 |

FOREIGN PATENT DOCUMENTS

| | | |
|---|---|---|
| TW | 200413907 | 8/2004 |
| TW | 200939221 | 9/2009 |
| TW | M369528 | 11/2009 |
| TW | 201037703 | 10/2010 |
| TW | 201106157 | 2/2011 |
| TW | 201145279 | 12/2011 |
| TW | 201214430 | 4/2012 |
| TW | 201220566 | 5/2012 |
| TW | 201225092 | 6/2012 |

OTHER PUBLICATIONS

Akifumi Kawahara et al. "An 8Mb Multi-Layered Cross-Point ReRAM Macro with 443MB/s Write Throughput", Solid-State Circuits Conference Digest of Technical Papers, Feb. 2012, pp. 432-434, IEEE, US.

Eike Linn et al. "Complimentary Resistive Switches for Passive Nanocrossbar Memories", Nature Materials, Apr. 2010, pp. 403-406, vol. 9, Macmillan Publishers Limited, US.

Yi-Chou Chen et al., "An Access-Transistor-Free (OT/IR) Non-Volatile Resistance Random Access Memory (RRAM) Using a Novel Threshold Switching, Self-Rectifying Chalcogenide Device", Electron Devices Meeting, Dec. 2003, pp. 37.4.1-37.4.4, IEEE, US.

S. Tappertzhofen et al. "Capacity Based Nondestuctive Readout for Complementary Resistive Switches", IOP Science Nanotechnology,Sep. 2011, pp. 1-7, vol. 22, No. 39, IOP Publishing, Germany.

China Patent Office, Office Action, Patent Application No. 201310013602.6, Feb. 25, 2015, China.

* cited by examiner

Reset (High)

Set (Low)

RESISTIVE RANDOM-ACCESS MEMORY DEVICES

CROSS REFERENCE TO RELATED APPLICATIONS

This application claims priority of Taiwan Patent Application No. 101139018, filed on Oct. 23, 2012, the entirety of which is incorporated by reference herein.

TECHNICAL FIELD

The disclosure relates to a resistive memory device, and relates to a resistive memory device with a write-back mechanism.

BACKGROUND

With the rising popularity of portable electronic devices, the requirements of non-volatile memory are increasing accordingly. Resistive random-access memory (RRAM or ReRAM) is a potential non-volatile memory for the next generation. Due to the merits of low power consumption, a small area, and fast operating speeds, the RRAM can be utilized to replace existing flash memory.

The memory cell of the RRAM may comprise a transistor and a resistor (1T1R). Since the resistive nature of the transistor is inversely proportional to the size of the transistor, the transistor must be maintained at a proper size in order that it does not affect the cross voltage of the RRAM memory cell. However, such a limitation causes the overall area of the device to be large, making miniaturization difficult. Therefore, the 0T1R or 0T2R RRAM are proposed.

When no transistor is used, the overall device area of the 0T1R or 0T2R memory cell can be greatly reduced. However, current can leak out from selected memory to unselected memory cells due to the lack of blockage provided by the transistor.

SUMMARY

An exemplary embodiment of a resistive random-access memory device comprises a memory array, a read circuit, a write-back circuit and a write-back logic circuit. The memory array comprises a plurality of memory cells. Each memory cell comprises at least one non-volatile memory unit. The read circuit is coupled to one of a select bit-line and a select word-line. The select bit-line and the select word-line are electrically connected to a selected memory cell among the memory cells, and the read circuit reads data stored in the selected memory cell and accordingly generates a first control signal. The write-back circuit performs a write-back operation on the selected memory cell according to a write-back control signal and a write-back voltage, so as to change a resistance state of the selected memory cell from a low resistance state to a high resistance state, and generates a second control signal according to the resistance state of the selected memory cell. The write-back logic circuit is coupled to the read circuit and the write-back circuit, and generates the write-back control signal according to the first control signal and the second control signal.

Another exemplary embodiment of a resistive random-access memory device capable of supporting a page-read mode comprises a memory array, a plurality of read circuits, an integrated logic circuit, a write-back logic circuit and a write-back circuit. The memory array comprises a plurality of memory cells. Each memory cell comprises at least one non-volatile memory unit. Each of the read circuits is coupled to a column of memory cells for reading data stored in a corresponding memory cell in a row of selected memory cells in a read operation and generates a corresponding bit data signal. The integrated logic circuit is coupled to the read circuits and generates a first control signal according to the bit data signal. The write-back logic circuit is coupled to the integrated logic circuit, and generates a write-back control signal according to the first control signal and a second control signal. The write-back circuit is coupled to the write-back logic circuit and performs write-back operations on the row of selected memory cells according to the write-back control signal and a write-back voltage. When any of the bit data signals generated by the read circuits indicates that the data stored in the corresponding memory cell has a first logic level, the write-back circuit changes a resistance state of one or more memory cell(s) in the row of selected memory cells having the first logic level from a low resistance state to a high resistance state via the write-back voltage.

A detailed description is given in the following embodiments with reference to the accompanying drawings.

BRIEF DESCRIPTION OF DRAWINGS

The disclosure can be more fully understood by reading the subsequent detailed description and examples with references made to the accompanying drawings, wherein.

DETAILED DESCRIPTION OF THE DISCLOSURE

Resistive memory devices with a write-back mechanism are proposed. The memory cell is written back to a high resistive state after a low resistive state is read, preventing the overall current leakage from affecting the operations of the circuit.

The following description is of the best-contemplated mode of carrying out the disclosure. This description is made for the purpose of illustrating the general principles of the disclosure and should not be taken in a limiting sense. The scope of the disclosure is best determined by reference to the appended claims.

Figure 1:
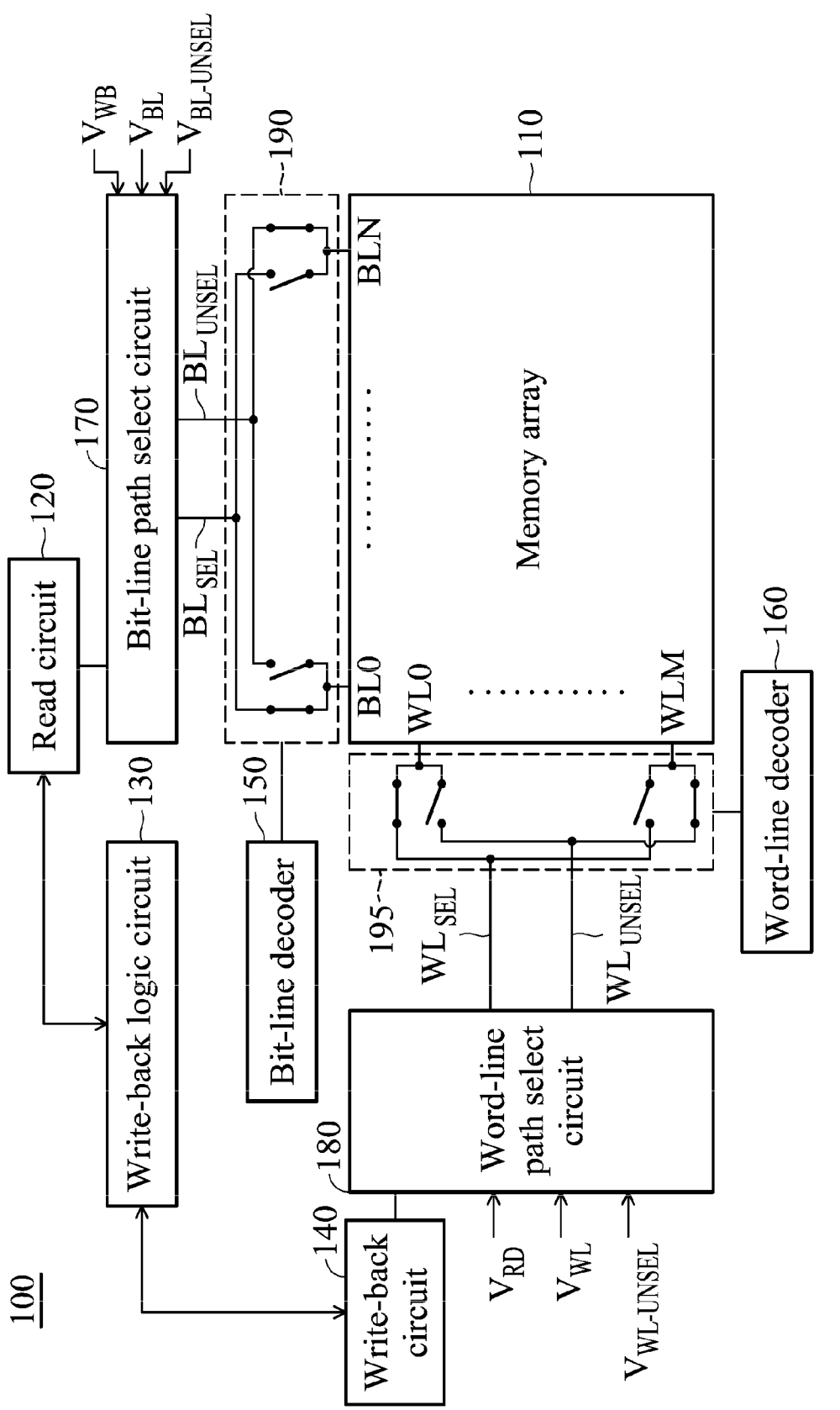
FIG. 1 shows a block diagram of a resistive random-access memory device according to a first embodiment of the disclosure.

FIG. 1 shows a block diagram of a resistive random-access memory (RRAM) device according to a first embodiment of the disclosure. The resistive random-access memory device 100 may comprise a memory array 110, a read circuit 120, a write-back logic circuit 130, a write-back circuit 140, a bit-line decoder 150, a word-line decoder 160, a bit-line path select circuit 170, a word-line path select circuit 180, a first switch module 190, and a second switch module 195. The memory array 110 may comprise a plurality of memory cells. According to an embodiment of the disclosure, each memory cell may comprise at least one non-volatile memory unit, wherein the non-volatile memory unit may comprise one or two resistive device(s). In an embodiment of the disclosure, when a memory cell comprises one resistive device, the overall operations may still be equivalent to that of the memory cell comprising two resistive devices. Therefore, in the following embodiments, the concepts of the disclosure are introduced based on the equivalent circuit of two resistive devices to represent one memory cell.

The first switch module 190 is coupled to a plurality of bit-lines BL0~BLN and comprises a plurality of switches for electrically connecting a selected bit-line to a select bit-line $BL_{SEL}$ and the unselected bit-lines to an unselect bit-line $BL_{UNSEL}$ according to the control signals generated by the bit-line decoder 150. The bit-line decoder 150 decodes the address of the selected memory cell based on the read/write address and generates corresponding control signals according to the address for controlling the operations of the first switch module 190. The bit-line path select circuit 170 receives a plurality of control voltages, comprising a write-back voltage $V_{WB}$, a selected bit-line voltage $V_{BL}$ and an unselected bit-line voltage $V_{BL\text{-}UNSEL}$, and provides adequate control voltages to the select bit-line $BL_{SEL}$ and the unselect bit-line $BL_{UNSEL}$ according to system control signals.

Similarly, the second switch module 195 is coupled to a plurality of word-lines WL0~WLM and comprises a plurality of switches for electrically connecting a selected word-line to a select word-line $WL_{SEL}$ and the unselected word-lines to an unselect word-line $WL_{UNSEL}$ according to the control signals generated by the word-line decoder 160. The word-line decoder 160 decodes the address of the selected memory cell based on the read/write address and generates corresponding control signals according to the address for controlling the operations of the second switch module 195. The word-line path select circuit 180 receives a plurality of control voltages, comprising a read voltage $V_{RD}$, a selected word-line voltage $V_{WL}$ and an unselected word-line voltage $V_{WL\text{-}UNSEL}$, and provides adequate control voltages to the select word-line $WL_{SEL}$ and the unselect word-line $WL_{UNSEL}$ according to system control signals.

Note that in the embodiments of the disclosure, the configurations of the word-lines and bit-lines may be exchanged and the disclosure should not be limited to the configurations as discussed above and shown in FIG. 1.

Figure 2A:
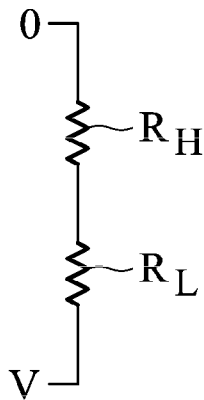
FIG. 2a shows an exemplary resistance state when a memory cell is reset.
Figure 2B:
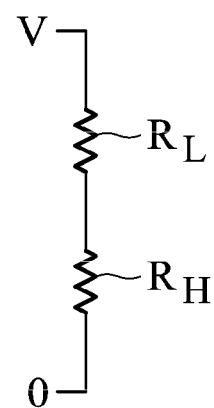
FIG. 2b shows an exemplary resistance state when a memory cell is set.

FIG. 2a shows an exemplary resistance state when a memory cell is reset. FIG. 2b shows an exemplary resistance state when a memory cell is set. As shown in FIG. 2a, when 0 volt and V volt are respectively applied to the electrodes on the two terminals of the resistive devices from the top to the bottom, the memory cell is reset, so as to represent a logic high state. An equivalent resistance state of the memory cell is $R_H+R_L$, wherein the $R_H$ represents high resistance and the $R_L$ represents low resistance. On the other hand, as shown in FIG. 2b, when V volt and 0 volt are respectively applied to the electrodes on the two terminals of the resistive devices from the top to the bottom, the memory cell is set, so as to represent a logic low state. An equivalent resistance state of the memory cell is $R_L+R_H$.

Figure 3:
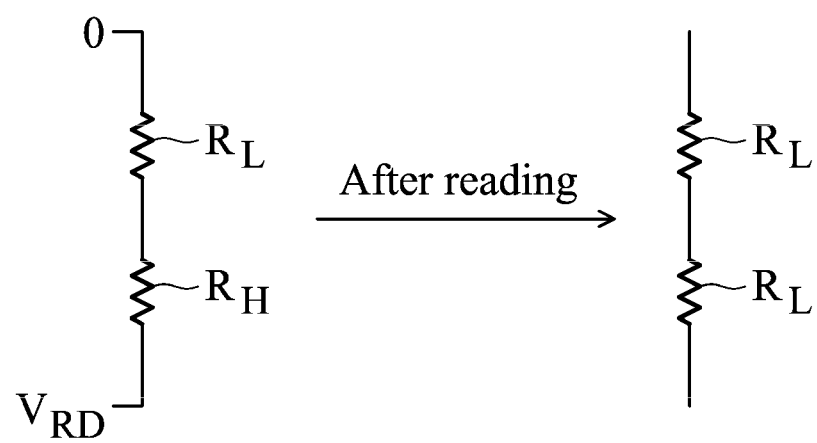
FIG. 3 is a schematic diagram showing the transience of the resistance state of a memory cell originally set to a logic low state after undergoing a destructive read.

FIG. 3 is a schematic diagram showing the transience of the resistance state of a memory cell originally set to a logic low state after undergoing a destructive read. Because the resistance of $(R_H+R_L)$ and $(R_L+R_H)$ are equivalent, the differences between two logic states cannot be distinguished during a read operation. Therefore, the destructive read is generally used when reading the RRAM, so as to force the resistance state of a memory cell originally set to a logic low state to transit from $(R_L+R_H)$ to $(R_L+R_L)$ by applying the read voltage $V_{RD}$ as shown in FIG. 3 during the read operation.

However, when the resistance state of the memory cell is changed to $(R_L+R_L)$ after reading, the overall resistance of the memory cell is greatly decreased and therefore causes undesired current leakage that could affect the operations of the memory device. To solve this problem, novel RRAM structures and the operations thereof are provided. Via a write-back mechanism, a portion of the $R_L$ transited by destructive read is changed back to $R_H$.

Figure 4:
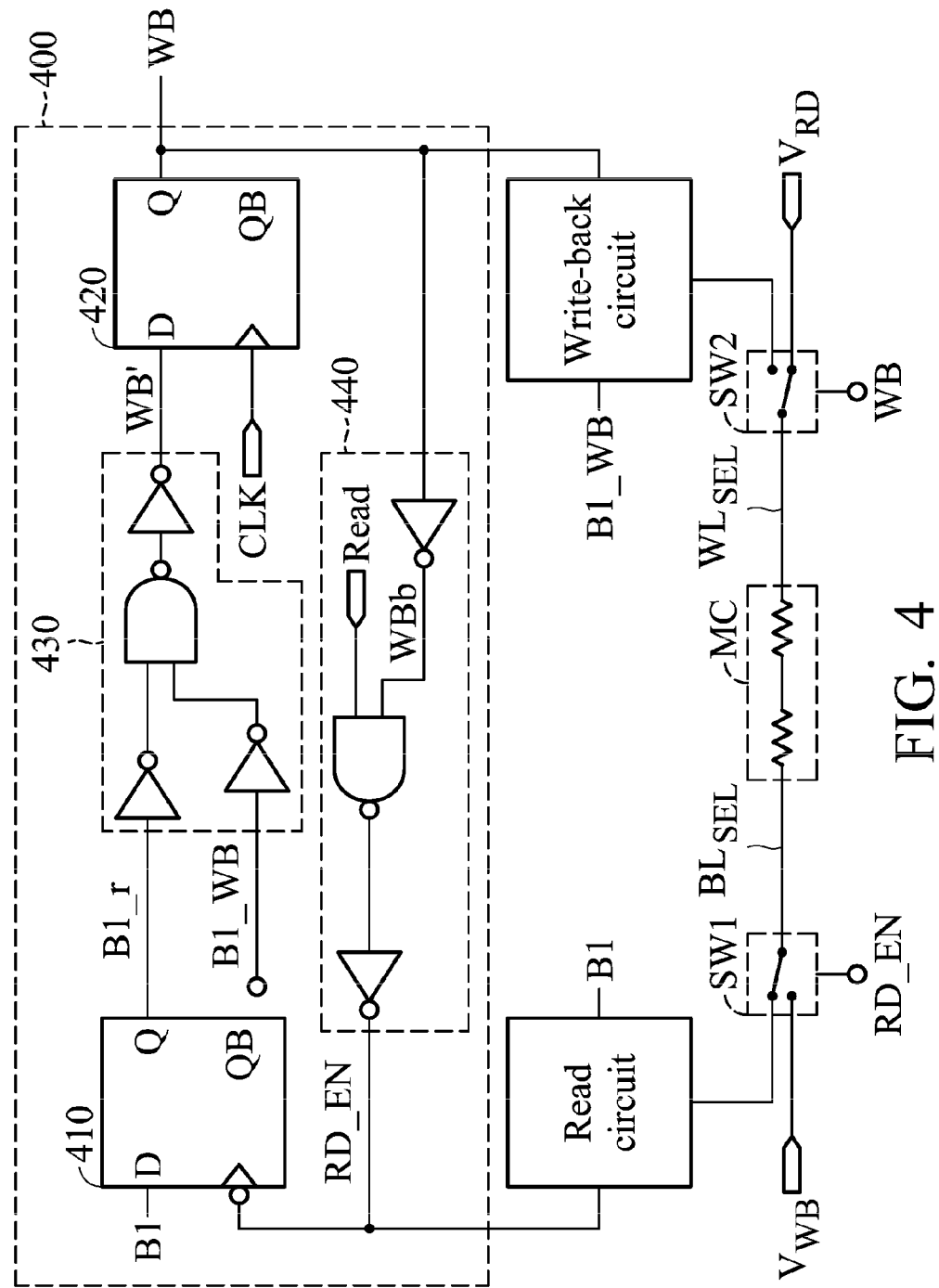
FIG. 4 shows a portion of the RRAM circuit diagram according to an embodiment of the disclosure.

FIG. 4 shows a portion of an RRAM circuit diagram according to an embodiment of the disclosure. In the embodiment, the RRAM device may operate in a single read mode. That is, one selected memory cell is read during a read operation. The selected memory cell MC is coupled to the read circuit via the select bit-line $BL_{SEL}$ and the switch SW1, and is coupled to the write-back circuit via the select word-line $WL_{SEL}$ and the switch SW2. In the embodiments of the disclosure, the configurations of the word-lines and bit-lines may be exchanged and the disclosure should not be limited to the configurations as discussed above and shown in FIG. 4.

The switch SW1 switches in response to the read control signal RD_EN and the switch SW2 switches in response to the write-back control signal WB, so as to electrically connect the selected memory cell MC to the read voltage $V_{RD}$ and the read circuit during the read operation and electrically connect the selected memory cell MC to the write-back voltage $V_{WB}$ and the write-back circuit during the write-back operation.

During the read operation, the read circuit reads the data stored in the selected memory cell MC and generates a first control signal B1 according to the data. The write-back logic circuit 400 is coupled to the read circuit and the write-back circuit for generating a write-back control signal WB according to a first control signal B1 and a second control signal B1_WB. During the write-back operation, the write-back circuit performs a write-back operation on the selected memory cell MC so as to change the resistance state of the selected memory cell MC from a low resistance state (for example, the $R_L+R_L$ as shown in FIG. 3) to a high resistance state (for example, the $R_L+R_H$ as shown in FIG. 2b or FIG. 3), and generates the second control signal B1_WB according to the resistance state of the selected memory cell MC. In the embodiment of the disclosure, the second control signal B1_WB is capable of indicating a current resistance state of the selected memory cell MC.

According to an embodiment of the disclosure, the write-back logic circuit 400 may comprise a first flip-flop 410 and a second flip-flop 420, for example, the D flip-flops, and a first logic circuit 430 and a second logic circuit 440. The first flip-flop 410 comprises a receiving terminal D for receiving and latching the first control signal B1, and outputs the first control signal B1 at the output terminal Q according to the read control signal RD_EN (wherein the QB is a complementary output terminal). For example, the first flip-flop 410 may output the first control signal B1 at a falling (or rising) edge of the read control signal RD_EN as the output signal B1_r.

The first logic circuit 430 receives the signals B1_r and B1_WB, and performs multiple logic operations on the signals B1_r and B1_WB to generate the output signal WB'. Since the output signal WB' and the write back control signal WB versus the output signal B1_r and the first control signal B1 have corresponding waveforms, the function of the first logic circuit 430 is equivalent to generate the write-back control signal WB according to the first control signal B1 and the second control signal B1_WB.

The second flip-flop 420 comprises a receiving terminal D for receiving and latching the signal WB', and outputs the signal WB' at the output terminal Q according to the clock signal CLK1 as the write-back control signal WB. The second logic circuit 440 is coupled to the first flip-flop 410 and the second flip-flop 420 for performing multiple logic operations based on the write-back control signal WB and the read signal Read to generate a read control signal RD_EN, wherein the read signal Read is a control signal generated by the system.

Figure 5:
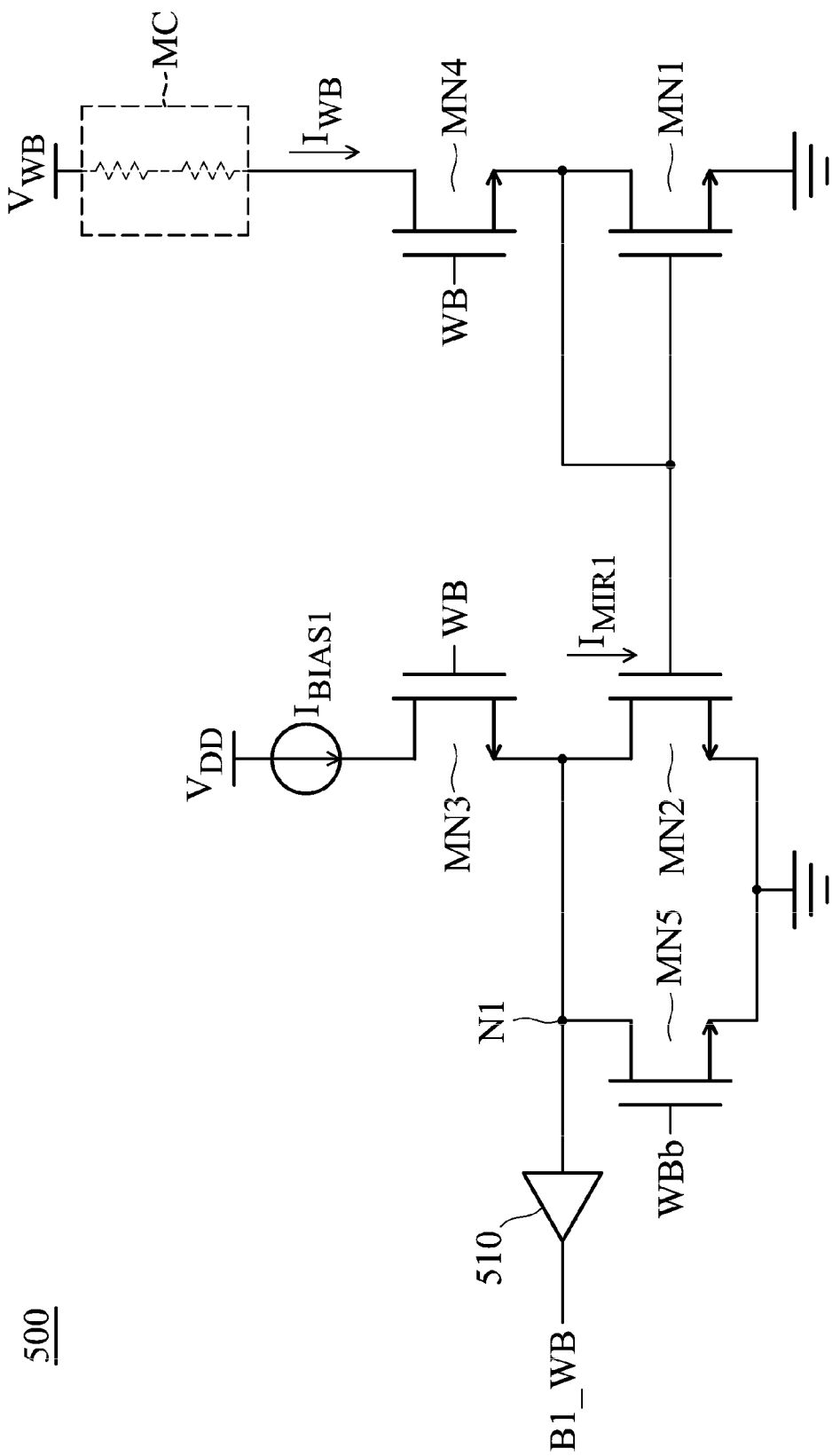
FIG. 5 shows a detailed circuit diagram of a write-back circuit according to an embodiment of the disclosure.

FIG. 5 shows a detailed circuit diagram of a write-back circuit according to an embodiment of the disclosure. The write-back circuit 500 may comprise transistors MN1~MN5 and a first driving circuit 510. The first transistor MN1 is coupled to a ground node. The second transistor MN2 is coupled to the ground node and comprises a second control electrode coupled to a first control electrode of the first transistor MN1. The first transistor MN1 and the second transistor MN2 may form a first current minor. The third transistor MN3 is coupled between the second transistor MN2 and a first reference current $I_{BIAS1}$ and comprises a third control electrode receiving the write-back control signal WB. The fourth transistor MN4 is coupled between the first transistor MN1 and the write-back voltage $V_{WB}$ and comprises a fourth control electrode receiving the write-back control signal WB. The fifth transistor MN5 is coupled to the second transistor MN2 and the third transistor MN3 and comprises a fifth control electrode receiving a complementary write-back control signal WBb.

According to an embodiment of the disclosure, when there is no need to perform the write-back operation, the fifth transistor MN5 may be turned on in response to the complementary write-back control signal WBb, so as to couple the node N1 to the ground node for resetting the voltage at the node N1. When the write-back operation is required, the third transistor MN3 and the fourth transistor MN4 are turned on in response to the write-back control signal WB and the write-back operation begins.

During the write-back operation, since the third transistor MN3 and the fourth transistor MN4 are turned on, the write-back current $I_{WB}$ flows through the selected memory cell MC and then flows through the first transistor MN1, wherein the resistance state of the data stored in the selected memory cell MC is reflected on the amount of write-back current $I_{WB}$. In addition, since the first transistor MN1 and the second transistor MN2 form a first current minor, the write-back circuit 500 generates the first mirror current $I_{MIR1}$ according to the write-back current $I_{WB}$.

The write-back circuit 500 compares the first minor current $I_{MIR1}$ with the first reference current $I_{BIAS1}$. By properly designing the sizes of the first transistor MN1 and the second transistor MN2, the write-back current $I_{WB}$ equals to the first minor current $I_{MIR1}$, or one of them can be a multiple of the other. When the first mirror current $I_{MIR1}$ is greater than the first reference current $I_{BIAS1}$, it means that the resistance state of the data stored in the selected memory cell MC is now a low resistance state (for example, $R_L+R_L$). Meanwhile, the voltage at the node N1 is discharged to the ground voltage, and the ground voltage is output through the first driving circuit 510 as the second control signal B1_WB for pulling down the voltage level of the second control signal B1_WB to a logic low level.

According to an embodiment of the disclosure, when the second control signal B1_WB has a logic low level, it means that the resistance state of the data stored in the selected memory cell MC is not yet changed to a high resistance state (for example, $R_L+R_H$). Meanwhile, the third transistor MN3 and the fourth transistor MN4 are kept turned on, until the resistance state of the data stored in the selected memory cell MC is changed from a low resistance state to a high resistance state.

On the other hand, when the first mirror current $I_{MIR1}$ is smaller than the first reference current $I_{BIAS1}$, it means that the resistance state of the data stored in the selected memory cell MC is now a high resistance state (for example, $R_L+R_H$). Meanwhile, the voltage at the node N1 is charged to the operation voltage $V_{DD}$, and the operation voltage $V_{DD}$ is output through the first driving circuit 510 as the second control signal B1_WB for pulling up the voltage level of the second control signal B1_WB to a logic high level.

When the second control signal B1_WB has a logic high level, it means that the resistance state of the data stored in the selected memory cell MC is changed to a high resistance state (for example, $R_L+R_H$). Meanwhile, the write-back logic circuit (for example, the write-back logic circuit 130 or 400) may change the voltage level of the write-back control signal WB in response to the voltage level change of the second control signal B1_WB, such that the third transistor MN3 and the fourth transistor MN4 are turned off and the write-back operation is completed.

Figure 6:
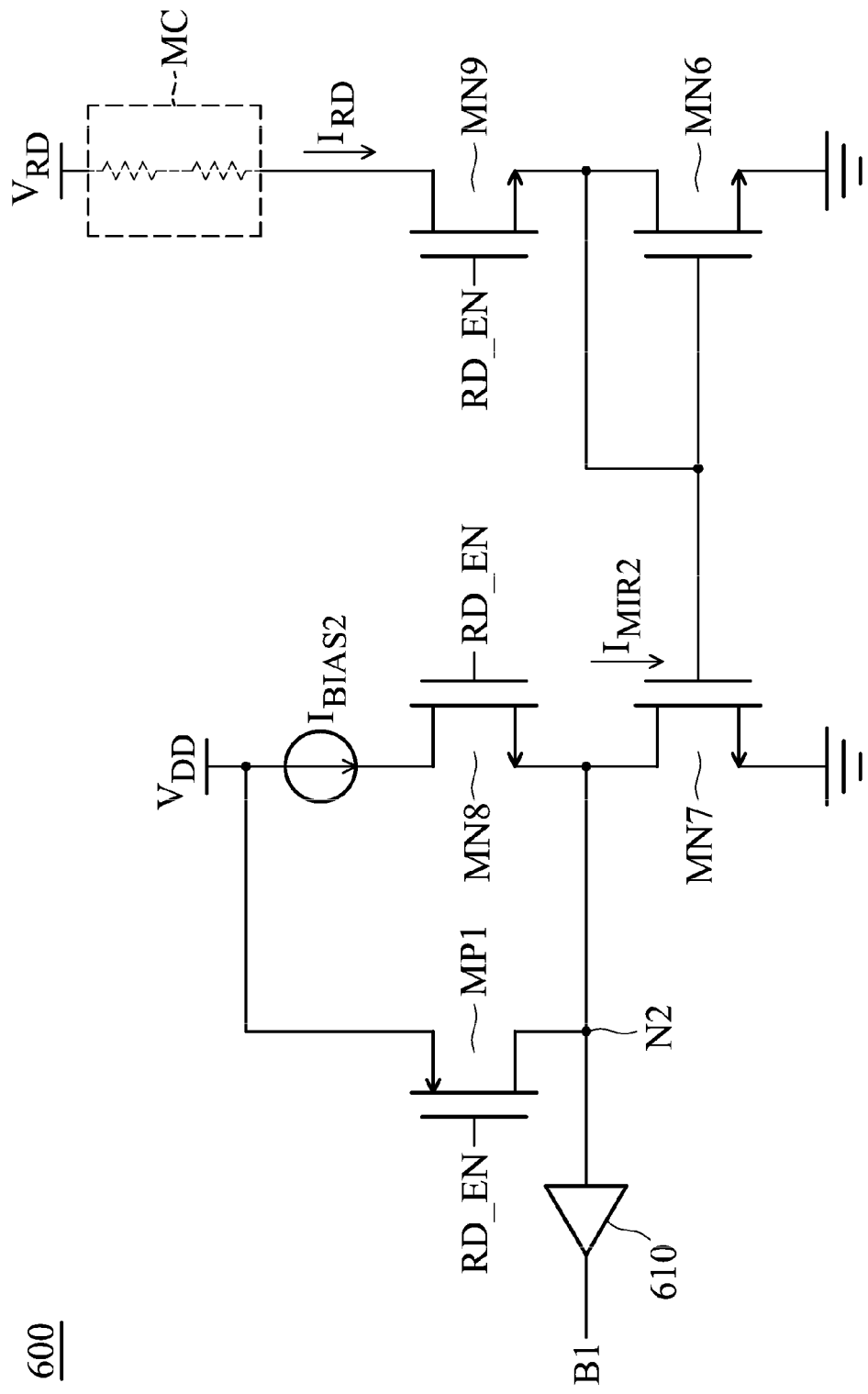
FIG. 6 shows a detailed circuit diagram of a read circuit according to an embodiment of the disclosure.

FIG. 6 shows a detailed circuit diagram of a read circuit according to an embodiment of the disclosure. The read circuit 600 may comprise transistors MN6~MN9, MP1 and a second driving circuit 610. The sixth transistor MN6 is coupled to the ground node. The seventh transistor MN7 is coupled to the ground node and comprises a seventh control electrode coupled to a sixth control electrode of the sixth transistor MN6. The sixth transistor MN6 and the seventh transistor MN7 form a second current minor. The eighth transistor MN8 is coupled between the seventh transistor MN7 and a reference current $I_{BIAS2}$ and comprises an eighth control electrode MN8 receiving a read control signal RD_EN. The ninth transistor MN9 is coupled between the sixth transistor MN6 and a read voltage $V_{RD}$ and comprises a ninth control electrode receiving the read control signal RD_EN. The tenth transistor MP1 is coupled to the seventh transistor MN7, and the eighth transistor MN8 and the reference current $I_{BIAS2}$, and comprises a tenth control electrode receiving the read control signal RD_EN.

According to an embodiment of the disclosure, during the read operation, the eighth transistor MN8 and the ninth transistor MN9 are turned on, such that the read current $I_{RD}$ flows through the selected memory cell MC and then flows through the sixth transistor MN6, wherein the resistance state (i.e. the data content) of the data stored in the selected memory cell MC is reflected on the amount of read current $I_{RD}$. In addition, since the sixth transistor MN6 and the seventh transistor MN7 form a second current mirror, the read circuit 600 generates the second mirror current $I_{MIR2}$ according to the read current $I_{RD}$.

The read circuit 600 compares the second minor current $I_{MIR2}$ with the second reference current $I_{BIAS2}$. By properly designing the sizes of the sixth transistor MN6 and the seventh transistor MN7, the read current $I_{RD}$ equals to the second mirror current $I_{MIR2}$, or one of them can be a multiple of the other. When the second minor current $I_{MIR2}$ is greater than the second reference current $I_{BIAS2}$, it means that the resistance state of the data stored in the selected memory cell MC is now a low resistance state (for example, $R_L+R_L$). Meanwhile, the voltage at the node N2 is discharged to the ground voltage, and the ground voltage is output through the second driving circuit 610 as the first control signal B1 for pulling down the voltage level of the first control signal B1 to a logic low level.

On the other hand, when the second mirror current $I_{MIR2}$ is less than the second reference current $I_{BIAS2}$, it means that the resistance state of the data stored in the selected memory cell MC is now a high resistance state (for example, $R_H+R_L$ or $R_L+R_H$). Meanwhile, the voltage at the node N2 is charged to the operation voltage $V_{DD}$, and the operation voltage is output through the second driving circuit 610 as the first control signal B1 for pulling up the voltage level of the first control signal B1 to a logic high level.

The disclosure is not limited to the type of logic gates and transistors adopted in FIG. 4, FIG. 5 and FIG. 6. Those who are skilled in this technology can still make various alterations and modifications on the types of logic gates and transistors without departing from the operational concept and spirit of this disclosure. Therefore, the scope of the disclosure shall be defined and protected by the following claims and their equivalents.

Figure 7:
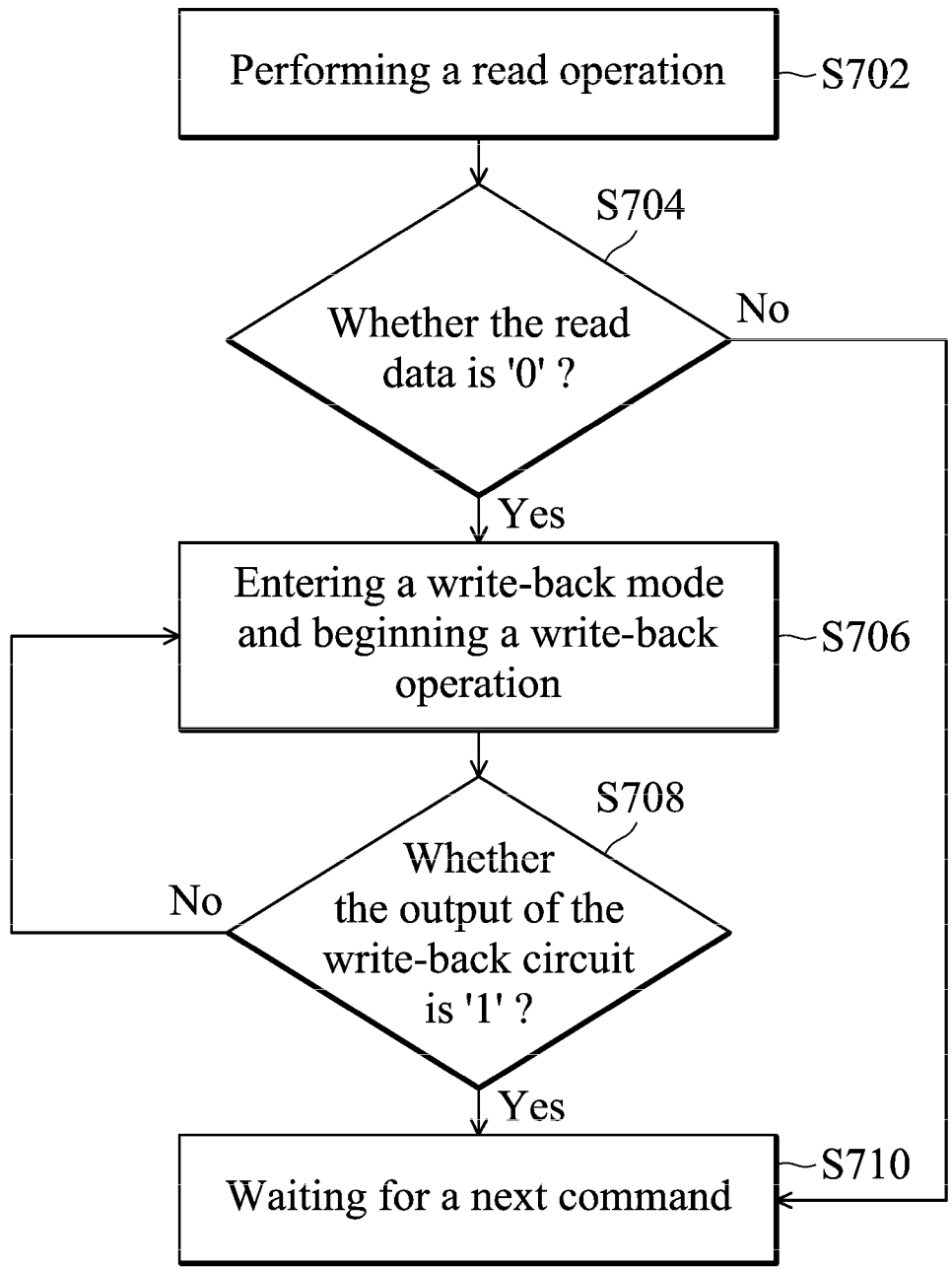
FIG. 7 shows a flow chart of a write-back mechanism according to an embodiment of the disclosure.

FIG. 7 shows a flow chart of a write-back mechanism according to an embodiment of the disclosure. First of all, suppose that the RRAM device receives a read command in a standby state, and begins performing a read operation (Step S702). Next, the RRAM device determines whether the read data is '0' based on the first control signal B1 output by the read circuit (Step S704). If not, the write-back operation is not performed and the process goes directly to step S710 to return to the standby state and wait for the next command (Step S710). If yes, it means that the data has undergone a destructive read in the read operation, and a write-back mode is entered to begin a write-back operation (Step S706). During the write-back operation, the RRAM device keeps tracking the signal output by the write-back circuit to check whether the write-back has succeeded (that is, whether the write-back circuit outputs '1') (Step S708). If not, the write-back operation is performed continuously. If yes, the process goes to step S710 to return to the standby state and wait for the next command (Step S710).

Figure 8:
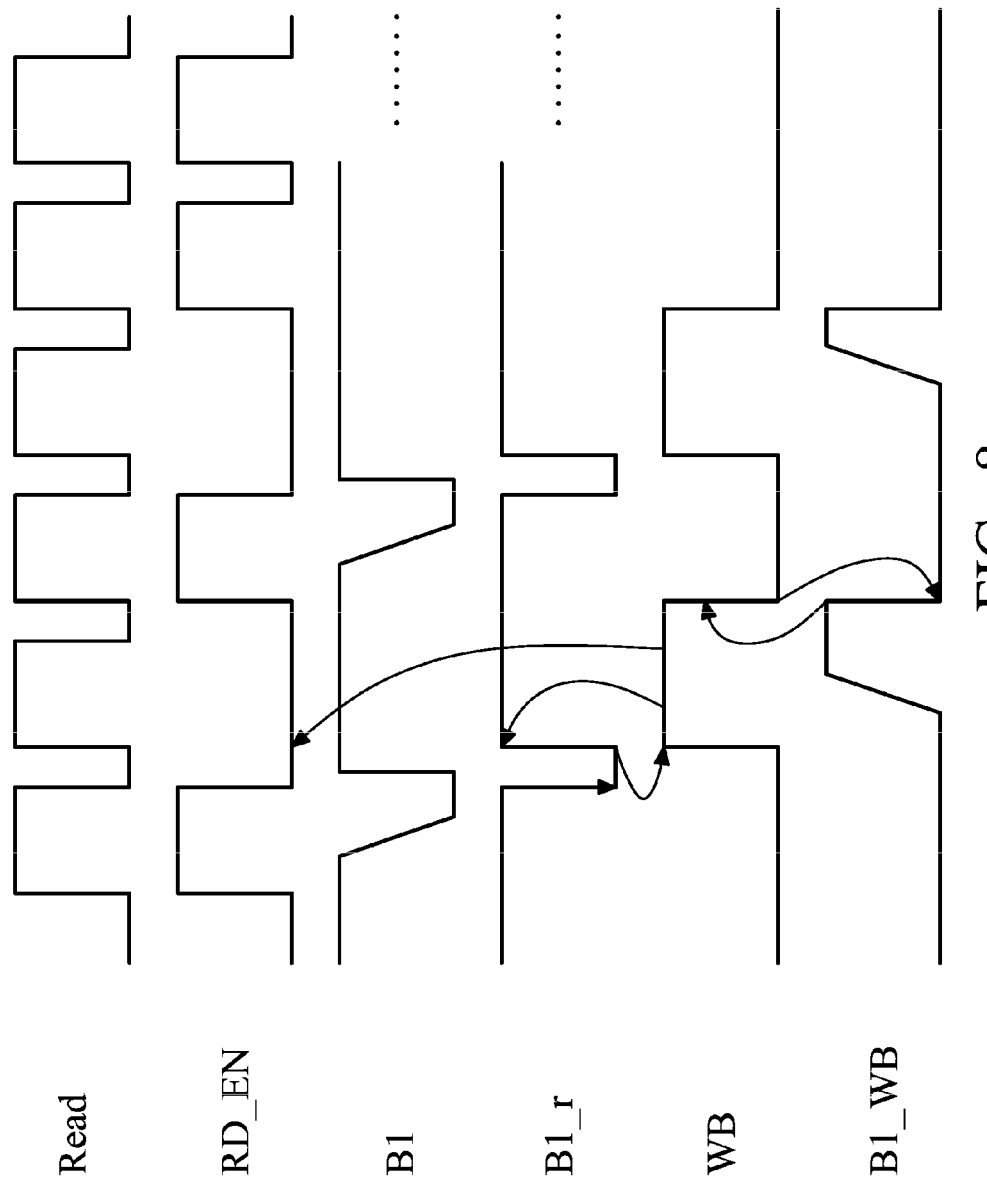
FIG. 8 shows exemplary signal waveforms of an RRAM device according to an embodiment of the disclosure.

FIG. 8 shows exemplary signal waveforms of an RRAM device according to an embodiment of the disclosure. When the first control signal B1 output by the read circuit is '0', the value of the first control signal B1 is stored into the first flip-flop 410 before the end of the current pulse of the read control signal RD_EN. When the next pulse of the read signal Read arrives, since the output signal B1_r of the first flip-flop 410 is '0' and the second control signal B1_WB is initially set to '0', the write-back control signal WB changes to '1'. After the write-back control signal WB changes to '1', the signals B1_r and RD_EN are set to '0'. At this time, the write-back mode is entered and the read operation is disabled.

After the write-back mode is entered, the write-back circuit writes the resistive device(s) back to a high resistance state, and keeps detecting whether the resistance state of the resistive device(s) actually returns to the high resistance state. When the second control signal B1_WB output by the write-back circuit changes to '1', it means that the resistive device(s) actually returns to the high resistance state. Thus, the write-back control signal WB is pulled down to '0' in the next cycle and the write-back operation is completed. After that, the control circuit of the RRAM device may keep performing the other operations, and the write-back operation begins until the next '0' is read.

Figure 9:
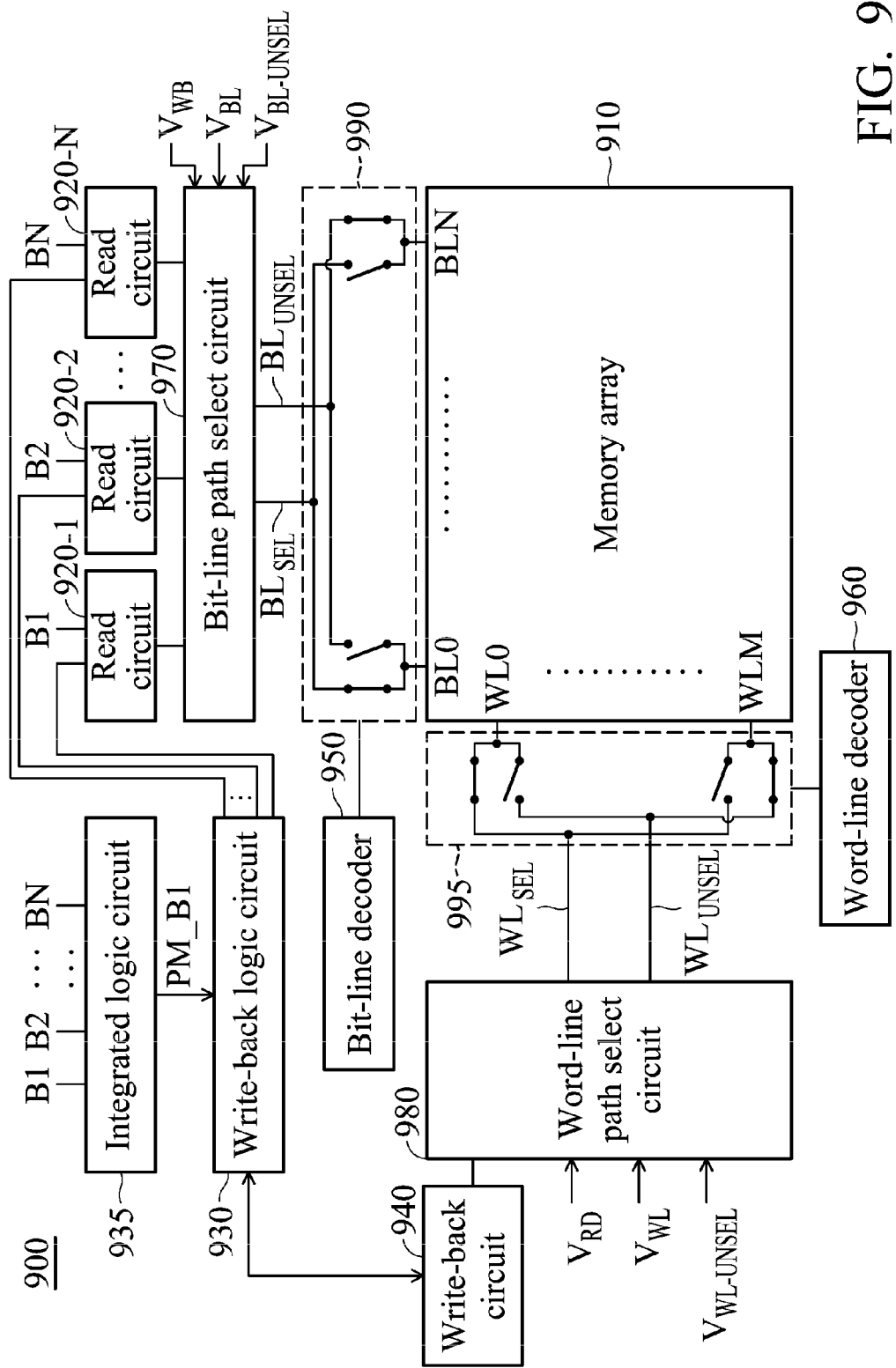
FIG. 9 shows a block diagram of an RRAM device according to a second embodiment of the disclosure.

FIG. 9 shows a block diagram of an RRAM device according to a second embodiment of the disclosure. In the embodiment, the RRAM device 900 is capable of supporting a page read mode, that is, the whole memory cells in a selected row (or column) are read at the same time during a read operation. The RRAM device 900 may comprise a memory array 910, a plurality of read circuits 920-1, 920-2, ... 920-N, a write-back logic circuit 930, an integrated logic circuit 935, a write-back circuit 940, a bit-line decoder 950, a word-line decoder 960, a bit-line path select circuit 970, a word-line path select circuit 980, a third switch module 990 and a fourth switch module 995. The RRAM device 900 has a similar structure to the RRAM device 100 shown in FIG. 1, and like items are indicated by like reference numbers; for descriptions of like items, refer to the corresponding paragraphs of FIG. 1, as they are not repeated here.

According to an embodiment of the disclosure, each of the read circuits 920-1~920-N may be respectively coupled to a column of memory cells for reading data stored in a corresponding memory cell in a row of selected memory cells in a read operation and generating one of the corresponding bit data signals B1~BN according to the read data. In the embodiments of the disclosure, the configurations of the word-lines and bit-lines may be exchanged and the disclosure should not be limited to the configurations as discussed above.

The integrated logic circuit 935 may be coupled to the read circuits 920-1~920-N for receiving the bit data signals B1~BN and generate a control signal PM_B1 according to the bit data signals B1~BN. The write-back logic circuit 930 is coupled to the integrated logic circuit 935 and generates the write-back control signal WB according to the control signal PM_B1 and the second control signal B1_WB output by the write-back circuit 940. The write-back circuit 940 is coupled to the write-back logic circuit 930 and performs the write-back operation on the row of selected memory cells according to the write-back control signal WB and a write-back voltage $V_{WB}$.

According to an embodiment of the disclosure, when any of the bit data signals B1~BN indicates that the data stored in the corresponding memory cell has a first logic level (for example, a logic low level, or a logic level capable of indicating the low resistance state $R_L+R_L$), the write-back circuit 940 changes the resistance state of one or more memory cell(s) in the row of selected memory cells having the first logic level from a low resistance state to a high resistance state via the write-back voltage $V_{WB}$.

According to an embodiment of the disclosure, the integrated logic circuit 935 may comprise a plurality of logic gates for performing logic operations on the bit data signals B1~BN to generate the control signal PM_B1. For example, the integrated logic circuit 935 may comprise one or more AND gates. Thus, once any of the bit data signals B1~BN is '0', the control signal PM_B1 is '0', which means that the write-back operation has to be performed.

In the embodiment, the circuit diagram of the write-back logic circuit 930 is similar to that of the write-back logic circuit 400. For example, the circuit diagram of the write-back logic circuit 930 may be obtained when the first control signal B1 in FIG. 4 is replaced by the control signal PM_B1.

In addition, in the embodiment, the circuit diagram of at least one of the read circuits 920-1~920-N is similar to that of the read circuit 600. For example, the circuit diagram of the one of the read circuits 920-1~920-N may be obtained when the selected memory cell MC in FIG. 6 is replaced by the memory cell corresponding to the read circuit in row of selected memory cells.

In addition, in the embodiment, the circuit diagram of the write-back circuit 940 is similar to that of the write-back circuit 500. For example, the circuit diagram of the write-back circuit 940 may be obtained when the selected memory cell MC in FIG. 5 is replaced by the row of selected memory cells. A plurality of memory cells in the row of selected memory cells may be coupled in parallel between the write voltage $V_{WB}$ and the fourth transistor MN4, and the first reference current $I_{BIAS1}$ may be redesigned based on the amount of coupled memory cells.

According to an embodiment of the disclosure, although the write-back circuit 940 performs write-back operations on the whole row of selected memory cells, the third switch module 990 may provide a proper write voltage $V_{WB}$ to the memory cell(s) having the first logic level (or the low resistance state) and provide a proper non-write voltage to the memory cell(s) having the second logic level (or the high resistance state) according to the control signals of the bit-line decoder 950. Therefore, the write-back operation(s) is/are actually only performed on the memory cell(s) that have undergone destructive read, and the data stored in the memory cell(s) that does not have to perform the write-back operation(s) thereon will not be damaged.

As discussed above, the proposed circuit structures and write-back mechanisms can not only solve the problems caused by a destructive read in the single read mode, but can also solve the problems caused by a destructive read in the page read mode.

Use of ordinal terms such as "first", "second", "third", etc., in the claims to modify a claim element does not by itself connote any priority, precedence, or order of one claim element over another or the temporal order in which acts of a method are performed, but are used merely as labels to distinguish one claim element having a certain name from another element having the same name (but for use of the ordinal term) to distinguish the claim elements.

While the disclosure has been described by way of example and in terms of preferred embodiment, it is to be understood that the disclosure is not limited thereto. Those who are skilled in this technology can still make various alterations and modifications without departing from the scope and spirit of this disclosure. Therefore, the scope of the present disclosure shall be defined and protected by the following claims and their equivalents.

What is claimed is:

1. A resistive random-access memory device, comprising:
   a memory array, comprising a plurality of memory cells, wherein each memory cell comprises at least one non-volatile memory unit;
   a read circuit, coupled to one of a select bit-line and a select word-line, wherein the select bit-line and the select word-line are electrically connected to a selected memory cell among the memory cells, and the read circuit reads data stored in the selected memory cell and generates a first control signal according to a resistance state of the selected memory cell;
   a write-back circuit, performing a write-back operation on the selected memory cell according to a write-back control signal and a write-back voltage, so as to change the resistance state of the selected memory cell from a low resistance state to a high resistance state, and generating a second control signal according to the resistance state of the selected memory cell; and
   a write-back logic circuit, coupled to the read circuit and the write-back circuit and generating the write-back control signal according to the first control signal and the second control signal, wherein the write-back control signal is set to a value to cause the write-back circuit to perform the write-back operation when both the first control signal and the second control signal indicate the low resistance state of the selected memory cell, wherein the write-back logic circuit comprises:
   a first flip-flop, receiving and latching the first control signal and outputting the first control signal at a falling or rising edge of a read control signal; and
   a first logic circuit, coupled to the first flip-flop and comprising at least a logic gate to perform a logic operation on the first control signal output by the first flip-flop and the second control signal to generate the write-back control signal, and
wherein the high and low resistance states respectively correspond to a high and low logic level of the selected memory cell.

2. The resistive random-access memory device as claimed in claim 1, wherein the non-volatile memory unit comprises one or two resistive devices.

3. The resistive random-access memory device as claimed in claim 1, wherein the write-back circuit is further electrically connected to the selected memory cell via the other of the select bit-line and the select word-line, and the write-back circuit comprises a first current mirror generating a first minor current according to a write-back current flowing through the selected memory cell, and the write-back circuit compares the first mirror current with a first reference current to generate a first comparison result and generates the second control signal according to the first comparison result.

4. The resistive random-access memory device as claimed in claim 1, wherein the write-back circuit comprises:
   a first transistor, coupled to a ground node and comprising a first control electrode;
   a second transistor, coupled to the ground node and comprising a second control electrode coupled to the first control electrode of the first transistor;
   a third transistor, coupled between the second transistor and a first reference current and comprising a third control electrode receiving the write-back control signal; and
   a fourth transistor, coupled between the first transistor and the write-back voltage and comprising a fourth control electrode receiving the write-back control signal.

5. The resistive random-access memory device as claimed in claim 4, wherein the write-back circuit further comprises:
   a fifth transistor, coupled to the second transistor and the third transistor and comprising a fifth control electrode receiving a complementary write-back control signal; and
   a first driving circuit, coupled to the fifth transistor for outputting the second control signal.

6. The resistive random-access memory device as claimed in claim 1, wherein the read circuit comprises a second current mirror generating a second mirror current according to a read current flowing through the selected memory cell, and the read circuit compares the second mirror current with a second reference current to generate a second comparison result and generates the first control signal according to the second comparison result.

7. The resistive random-access memory device as claimed in claim 6, wherein the read circuit comprises:
   a sixth transistor, coupled to a ground node and comprising a sixth control electrode;
   a seventh transistor, coupled to the ground node and comprising a seventh control electrode coupled to the sixth control electrode of the sixth transistor;
   an eighth transistor, coupled between the seventh transistor and a second reference current and comprising an eighth control electrode receiving a read control signal; and
   a ninth transistor, coupled between the sixth transistor and a read voltage and comprising a ninth control electrode receiving the read control signal.

8. The resistive random-access memory device as claimed in claim 7, wherein the read circuit further comprises:
- a tenth transistor, coupled between the seventh transistor and the eighth transistor and comprising a tenth control electrode receiving the read control signal; and
- a second driving circuit, coupled to the tenth transistor and outputting the first control signal.

9. The resistive random-access memory device as claimed in claim 1, wherein the write-back logic circuit further comprises:
- a second flip-flop, receiving and latching the write-back control signal and outputting the write-back control signal according to a clock signal; and
- a second logic circuit, coupled to the first flip-flop and the second flip-flop and generating the read control signal according to the write-back control signal received from the second flip-flop and a read signal.

10. A resistive random-access memory device capable of supporting a page-read mode, comprising:
- a memory array, comprising a plurality of memory cells, wherein each memory cell comprises at least one non-volatile memory unit;
- a plurality of read circuits, each coupled to a column of memory cells for reading data stored in a corresponding memory cell in a row of selected memory cells in a read operation and generating a corresponding bit data signal according to a resistance state of the corresponding memory cell;
- an integrated logic circuit, coupled to the read circuits and generating a first control signal according to the bit data signal;
- a write-back logic circuit, coupled to the integrated logic circuit and generating a write-back control signal according to the first control signal and a second control signal; and
- a write-back circuit, coupled to the write-back logic circuit and performing write-back operations on the row of selected memory cells according to the write-back control signal and a write-back voltage, and generating the second control signal according to the resistance state of the corresponding memory cell, wherein the write-back control signal is set to a value to cause the write-back circuit to perform the write-back operation when both the first control signal and the second control signal indicate the low resistance state of the corresponding memory cell,
- wherein when any of the bit data signals generated by the read circuits indicates that the data stored in the corresponding memory cell has a first logic level, the write-back circuit changes the resistance state of one or more memory cell(s) in the row of selected memory cells having the first logic level from a low resistance state to a high resistance state via the write-back voltage,
- wherein the write-back logic circuit comprises:
  - a first flip-flop, receiving and latching the first control signal and outputting the first control signal at a falling or rising edge of a read control signal; and
  - a first logic circuit, coupled to the first flip-flop and comprising at least a logic gate to perform a logic operation on the first control signal output by the first flip-flop and the second control signal to generate the write-back control signal, and
- wherein the high and low resistance states respectively correspond to a high and low logic level of the corresponding memory cell.

11. The resistive random-access memory device as claimed in claim 10, wherein the non-volatile memory unit comprises one or two resistive device(s).

12. The resistive random-access memory device as claimed in claim 10, wherein the write-back circuit comprises a first current mirror generating a first mirror current according to a write-back current flowing through the row of selected memory cells, and the write-back circuit compares the first mirror current with a first reference current to generate a first comparison result and generates the second control signal according to the first comparison result.

13. The resistive random-access memory device as claimed in claim 10, wherein the write-back circuit comprises:
- a first transistor, coupled to a ground node and comprising a first control electrode;
- a second transistor, coupled to the ground node and comprising a second control electrode coupled to the first control electrode of the first transistor;
- a third transistor, coupled between the second transistor and a first reference current and comprising a third control electrode receiving the write-back control signal;
- a fourth transistor, coupled between the first transistor and the write-back voltage and comprising a fourth control electrode receiving the write-back control signal;
- a fifth transistor, coupled to the second transistor and the third transistor and comprising a fifth control electrode receiving a complementary write-back control signal; and
- a first driving circuit, coupled to the fifth transistor and outputting the second control signal.

14. The resistive random-access memory device as claimed in claim 10, wherein at least one of the read circuits comprises a second current mirror generating a second mirror current according to a read current flowing through the corresponding memory cell in the row of selected memory cells, and the at least one of the read circuits compares the second mirror current with a second reference current to generate a second comparison result and generates the corresponding bit data signal according to the second comparison result.

15. The resistive random-access memory device as claimed in claim 14, wherein the at least one of the read circuits comprises:
- a sixth transistor, coupled to a ground node and comprising a sixth control electrode;
- a seventh transistor, coupled to the ground node and comprising a seventh control electrode coupled to the sixth control electrode of the sixth transistor;
- an eighth transistor, coupled between the seventh transistor and a second reference current and comprising an eighth control electrode receiving a read control signal;
- a ninth transistor, coupled between the sixth transistor and a read voltage and comprising a ninth control electrode receiving the read control signal;
- a tenth transistor, coupled between the seventh transistor and the eighth transistor and comprising a tenth control electrode receiving the read control signal; and
- a second driving circuit, coupled to the tenth transistor and outputting the corresponding bit data signal.

16. The resistive random-access memory device as claimed in claim 10, wherein the write-back logic circuit further comprises:
- a second logic circuit, coupled to the first flip-flop and generating the read control signal according to the write-back control signal and a read signal.

17. The resistive random-access memory device as claimed in claim 16, wherein the first flip-flop is a D flip-flop.

* * * * *